United States Patent
Scott

(10) Patent No.: US 9,976,411 B2
(45) Date of Patent: May 22, 2018

(54) POSITION INDICATOR FOR DETERMINING THE RELATIVE POSITION AND/OR MOVEMENT OF DOWNHOLE TOOL COMPONENTS, AND METHOD THEREOF

(71) Applicant: Roxar Flow Measurement, Stavanger (NO)

(72) Inventor: Michael Scott, Tananger (NO)

(73) Assignee: ROXAR FLOW MEASUREMENT AS, Stavanger (NO)

( * ) Notice: Subject to any disclaimer, the term of this patent is extended or adjusted under 35 U.S.C. 154(b) by 0 days. days.

(21) Appl. No.: 15/518,144

(22) PCT Filed: Oct. 28, 2015

(86) PCT No.: PCT/EP2015/075035
§ 371 (c)(1),
(2) Date: Apr. 10, 2017

(87) PCT Pub. No.: WO2016/066713
PCT Pub. Date: May 6, 2016

(65) Prior Publication Data
US 2017/0241258 A1     Aug. 24, 2017

(30) Foreign Application Priority Data
Oct. 30, 2014   (GB) .................................. 1419350.2

(51) Int. Cl.
| | | |
|---|---|---|
| *G01V 3/00* | (2006.01) | |
| *E21B 47/09* | (2012.01) | |
| *E21B 47/06* | (2012.01) | |
| *E21B 34/06* | (2006.01) | |
| *G01R 33/00* | (2006.01) | |
| *E21B 34/00* | (2006.01) | |

(52) U.S. Cl.
CPC .......... *E21B 47/0905* (2013.01); *E21B 34/06* (2013.01); *E21B 47/06* (2013.01);
(Continued)

(58) Field of Classification Search
CPC .... E21B 17/003; E21B 17/021; E21B 17/023; E21B 17/026; E21B 17/028; E21B 17/08;
(Continued)

(56) References Cited

U.S. PATENT DOCUMENTS 3,434,046 A * 3/1969 Lorenzino, Jr. ...... E21B 47/0905
                                                    324/221
5,666,050 A * 9/1997 Bouldin .............. E21B 47/0905
                                                    166/66.5
(Continued)

FOREIGN PATENT DOCUMENTS

CN         1573012 A      2/2005
CN       101384793 A      3/2009
(Continued)

OTHER PUBLICATIONS

International Search Report and Written Opinion for application No. PCT/GB2015/075035 dated Feb. 15, 2016.
(Continued)

*Primary Examiner* — Arleen M Vazquez
*Assistant Examiner* — Steven Yeninas
(74) *Attorney, Agent, or Firm* — Workman Nydegger

(57) ABSTRACT

A magnetic sensor array is presented for a well apparatus for determining the position of at least one movable component with respect to a fixed component of a downhole tool. The array comprises at least one conductor member having a plurality of contact regions spaced apart at first intervals of at least a first length along a longitudinal axis of said at least one conductor member and a plurality of magnetic sensors, each one of which is operably coupled to one of said plurality of contact regions and actuatable by a magnetic field from a magnetic actuator.

18 Claims, 8 Drawing Sheets

(52) U.S. Cl.
CPC ........ *E21B 47/065* (2013.01); *G01R 33/0005* (2013.01); *E21B 2034/007* (2013.01)

(58) Field of Classification Search
CPC .......... E21B 17/16; E21B 34/06; E21B 47/01; E21B 47/011; E21B 47/06; E21B 47/065; E21B 47/0905; E21B 47/091; E21B 47/0915; G01V 3/18; G01V 3/26; G01V 3/28; G01R 33/0005
USPC .................. 175/4.51, 45; 324/221, 345, 346
See application file for complete search history.

(56) References Cited

U.S. PATENT DOCUMENTS

| | | | |
|---|---|---|---|
| 7,377,333 | B1 | 5/2008 | Sugiura |
| 2005/0189938 | A1 | 9/2005 | Schley et al. |
| 2007/0170915 | A1 | 4/2007 | Gissler |
| 2008/0294344 | A1* | 11/2008 | Sugiura ................ E21B 47/024 702/6 |
| 2009/0128141 | A1 | 5/2009 | Hopmann et al. |
| 2013/0002255 | A1 | 1/2013 | Shampine |
| 2013/0113468 | A1 | 5/2013 | Gao et al. |
| 2013/0206401 | A1* | 8/2013 | Bhoite ................ E21B 47/0905 166/255.1 |

FOREIGN PATENT DOCUMENTS

| | | |
|---|---|---|
| CN | 103541719 A | 1/2014 |
| CN | 103649461 A | 3/2014 |

OTHER PUBLICATIONS

International Preliminary Report on Patentability for application No. PCT/GB2015/075035 dated Feb. 14, 2017.

* cited by examiner

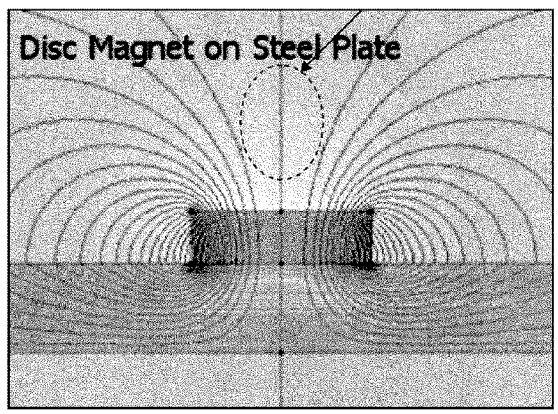
(a)
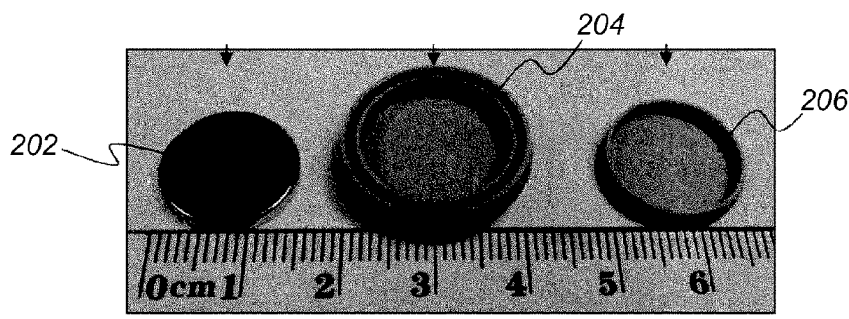
(b)
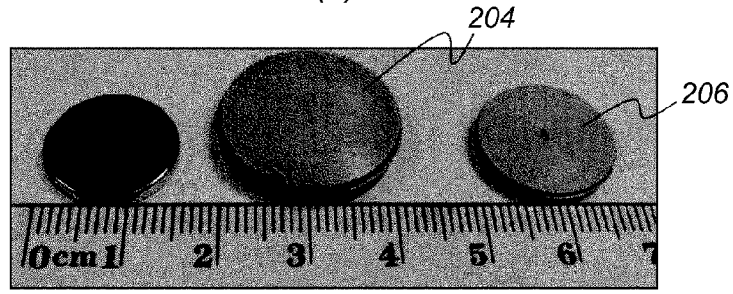
(c)
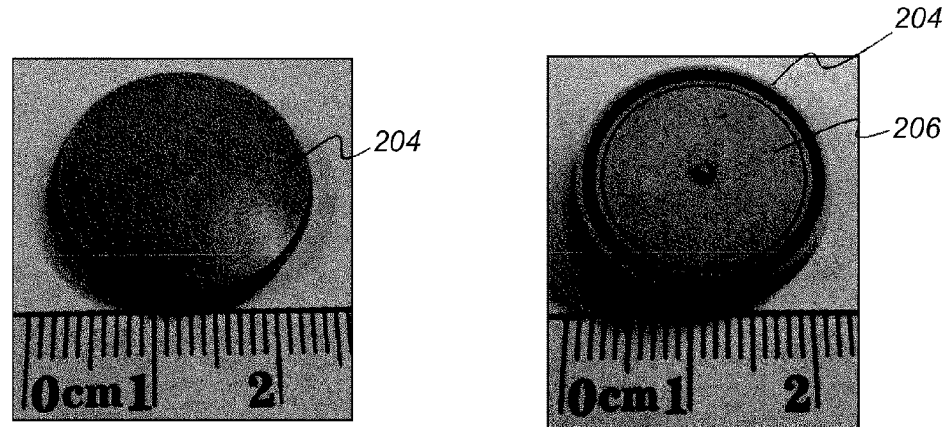
(d) (e)
FIG. 9

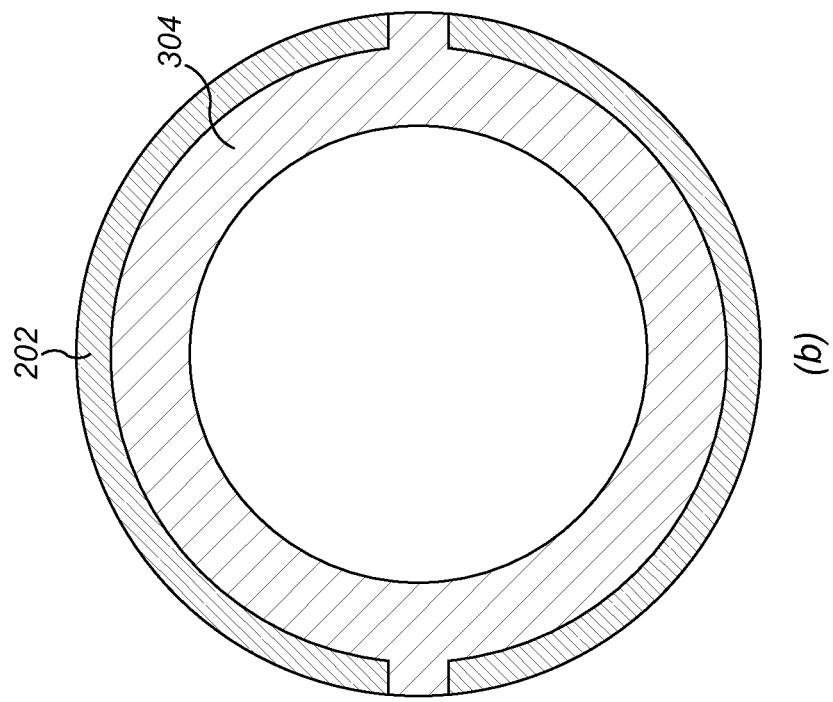
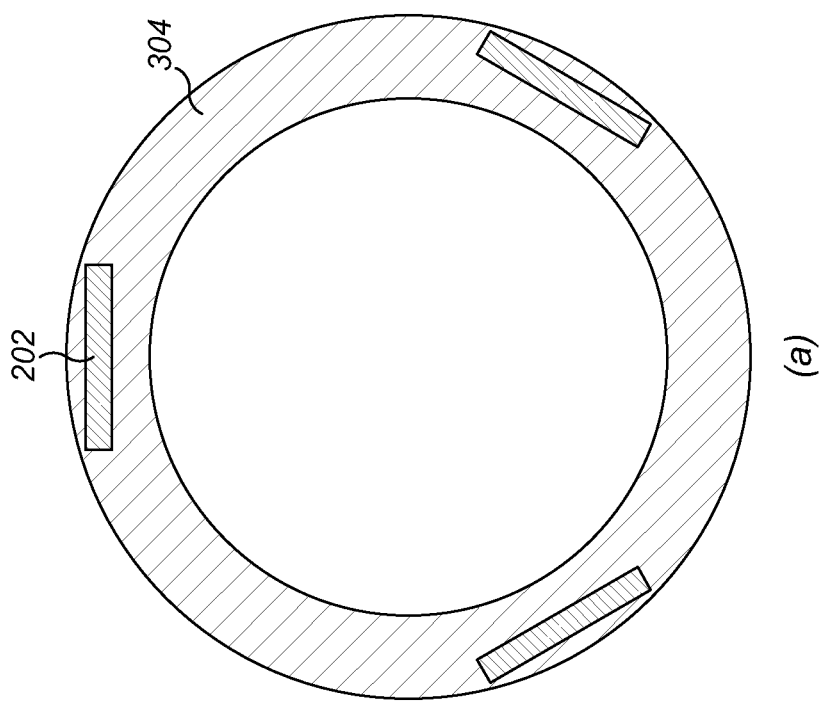
FIG. 11

POSITION INDICATOR FOR DETERMINING THE RELATIVE POSITION AND/OR MOVEMENT OF DOWNHOLE TOOL COMPONENTS, AND METHOD THEREOF

The present invention relates generally to the field of oil and gas production, and in particular to the field of downhole equipment and its control and operation in a subterranean well. Even more particular, the present invention relates to a magnetic sensor array, apparatus and method for determining the relative position and movement of downhole tool components.

INTRODUCTION

In the oil and gas industry today, intelligent or smart well completions are fundamental for maximizing/optimizing the hydrocarbon (oil, gas) production rate. For example, downhole pressure and temperature data may be obtained from respective gauges in order to identify potential problems in the reservoir or wellbore. In addition, the so called smart well completion may include zonal isolation and remote controlled individual zone production rates utilizing specific downhole tools such as, for example, a sliding sleeve separation tool. Hydraulically actuated sliding sleeves are operated via a hydraulic control line that is installed on the production tubing.

Traditionally, the operator monitors the applied hydraulic pressure when moving the sliding sleeve into either a "fully-open" or a "fully-closed" position. These traditional tools, however, are not designed to allow exact positioning of the sliding sleeve and/or determine actual movement (e.g. speed) of the sliding sleeve, when applying the hydraulic pressure.

It is commonly known to use magnetic sensors for determining the position of the moving part in a downhole application tool. Here, permanent magnets are installed on the moving part and the emanated magnetic fields are picked up by the magnetic sensors. However, the known prior techniques usually require very complicated electronics in order to "drive" the magnetic sensors, which makes the downhole tool much less reliable due to the high risk of components failure in the very harsh subterranean environment (e.g. extreme temperatures, pressures or humidity).

In particular, permanent magnets are formed from many small dipoles that are caused by orbiting electrons within the atoms. Each of the magnet's dipoles generates its own magnetic field, and the sum of all the dipoles produce a total magnetic flux density that is relatively weak when the individual magnetic fields are randomly arranged, i.e. not aligned. However, when applying a powerful external magnetic field to the permanent magnet, all magnetic fields of the dipoles are aligned so as to form a magnetic vector of increased magnetic flux density. In the event the temperature increases relative to room temperature, the magnetic flux density of the magnetic vector may decrease, because the dipoles rearrange back into misalignment and therefore cause reversible magnetic losses (e.g. at high temperature, the magnetic flux density is considerable weaker than at room temperature, i.e. 21° C.), which may be recovered when the temperature returns to its original temperature.

Many known applications of magnetic sensors "depend" on knowing the strength of the permanent magnet's magnetic field, so that the sensors (e.g. Hall sensors) can be calibrated to the applied effective magnetic field strength and/or polarity emanated at specific temperature ranges. However, this considerably affects the accuracy and ease of use when utilizing sensors according to the known prior art. Also, commonly used magnetic sensors (e.g. Hall sensors) have a relatively low maximum operating temperature (e.g. 150° C. for Hall sensors), therefore limiting the range of application.

In addition, the magnetic sensors used in the prior art (e.g. Hall sensors) are active components that require a dedicated power supply, as well as, signal amplification and filtering, since the power output of the signal is often weak and affected by noise. For example, in order to acquire the magnet field data from a sensor array, multiplexers and respective controllers may be utilized to switch between the appropriate Hall sensors, thus, significantly increasing the processing time needed to determine the current position. The electronic components required to "drive" the sensors and process the signals further affect the reliability of the system due to the higher risks associated with downhole applications. Also, the available complex systems naturally require considerable space to house and connect the electronic components (e.g. utilizing Printed Circuit Boards—PCBs), but space is very limited in the downhole environment and some of the available systems may not practically fit at the downhole tool. Furthermore, the use of PCBs can, for example, provoke other problems, such as "outgassing" or "delamination" in a high-temperature and/or high-pressure environment.

SUMMARY OF THE INVENTION

Preferred embodiment(s) of the invention seek to overcome one or more of the above disadvantages of the prior art.

According to a first aspect of the invention there is provided a magnetic sensor array for a well apparatus for determining the position of at least one movable component with respect to a fixed component of a downhole tool, comprising:
  at least one conductor member having a plurality of contact regions spaced apart at first intervals of at least a first length along a longitudinal axis of said at least one conductor member;
  a plurality of magnetic sensors, each one of which is operably coupled to one of said plurality of contact regions and actuatable by a magnetic field from a magnetic actuator.

This provides the advantage of a "real-time" position indicator that is capable of providing position information of a moveable part of a downhole tool, for example a sliding sleeve of a sliding sleeve separation tool, with considerable accuracy. In addition, the apparatus of the present invention provides an improved robustness to the extreme conditions found in a downhole environment (e.g. high temperature, pressure and humidity). Furthermore, the apparatus of the present invention provides the advantage of greatly reduced complexity, resulting in a minimised number of components and reduced manufacturing costs. In particular, the advantageous "PCB-less" design of the magnetic sensor array provides a very compact and reliable sensor system, where common risks of "outgassing" and "delamination" are greatly reduced, therefore, allowing operation in significantly higher temperatures.

Advantageously, each one of said plurality of magnetic sensors may comprise a plurality of magnetic sensor elements arranged circumferentially spaced about said longitudinal axis. Preferably, said plurality of magnetic sensor elements may be circumferentially spaced about said longitudinal axis equidistantly. Even more preferably, each one of said plurality of magnetic sensors may comprise two magnetic sensor elements arranged diametrically opposite each other. Even more preferably, each one of said plurality of magnetic sensors may comprise four magnetic sensor elements arranged diametrically opposite each other. This provides the advantage of greatly improved redundancy due to rotationally immunity of the magnetic sensors.

Advantageously, said plurality of magnetic sensor elements of each one of said plurality of magnetic sensors may form a parallel circuit with said at least one conductor member. Additionally, said plurality of magnetic sensors may be actuatable mutually exclusive of each other. Preferably, said at least one conductor member may be a metal wire. Even more preferably, said conductor member may be a copper wire having a substantially rectangular or square cross-section. This provides the advantage of improved simplicity, reducing the number of components and materials required, therefore, further improving the robustness and compactness of the magnetic sensor array.

Advantageously, each one of said plurality of magnetic sensors may be attached to a respective contact region of said plurality of contact regions via an adhesive and/or a fastening member. Preferably, said adhesive may be any one of a conductive adhesive or solder. In particular, using a conductive adhesive provides the advantage of reducing potentially aggressive flux from the apparatus assembly, minimising the requirements of the cleaning standard.

Advantageously, said plurality of magnetic sensors may be connected to a plurality of predetermined resistors, so as to form a resistor network adapted to provide a plurality of discrete signal outputs for each one of said plurality of magnetic sensors. Preferably, said discrete signal output may be any one of a discrete voltage or discrete frequency.

Preferably, said first intervals between said plurality of magnetic sensors may be equidistant. Alternatively, the said first intervals between said plurality of magnetic sensors may be proportional to a predetermined function. For example, the intervals may follow a logarithmic or exponential function.

Preferably, said plurality of magnetic sensor elements may be a plurality of reed switches. This provides the advantage that the sensor mechanism does not depend on the magnetic field strength from, for example, the permanent magnets. It allows determining the movement of the component solely based on logic, and therefore reduces the complexity usually required in sensor mechanisms relying on field strength measurements (e.g. Hall sensors). In addition, utilizing Reed switches provides the advantage that the system does not need to be calibrated for any effective magnetic field strength over a range of potential temperature changes, as long as the magnetic field of the actuator is sufficient to activate the Reed switch(es). In addition, Reed switches are operable at temperatures in excess of 300° C. Furthermore, utilizing Reed switches provides the advantage that the actual magnetic polarity is irrelevant to the operation of the sensors.

Advantageously, the magnetic sensor array may further comprise a plurality of first insulation members adapted to sealingly encase each one of said plurality of first intervals of said conductor member. Additionally, the magnetic sensor array may further comprise a second insulation member adapted to sealingly encase said magnetic sensor array. This provides the advantage of providing insulation between the contact regions and protection of the sensors and array from the potentially harsh environmental conditions downhole. In particular, insulation shrink tubes may be used to encase the intervals of the copper wire and/or the sensor array, so as to provide a very compact and robust assembly.

According to a second aspect of the invention there is provided an apparatus for determining the position of at least one movable component with respect to a fixed component of a downhole tool, comprising:

a magnetic sensor array according to the first aspect of the present invention, coupleable to the fixed component such that a longitudinal axis of said magnetic sensor array is aligned in the direction of movement of the movable component;

at least one magnetic actuator, coupleable to the movable component, wherein said at least a one magnetic actuator is adapted to actuate any one of a plurality of magnetic sensors of said magnetic sensor array, so as to effect a discrete signal output for each one of a predetermined number of positions of said moveable component relative to said fixed component.

Advantageously, said magnetic sensor array may comprise two or more equivalent parallel rows of said plurality of magnetic sensors, arranged such that positions of corresponding said magnetic sensors are aligned with respect to each other in the direction of movement of the moveable component.

Alternatively, said sensor array may comprise two or more equivalent parallel rows of said plurality of magnetic sensors, arranged such that positions of corresponding said magnetic sensors are offset with respect to each other in the direction of movement of the moveable component.

Advantageously, said at least one magnetic actuator may comprise at least one permanent magnet arranged so as to emanate a magnetic field in a direction that is generally normal to a surface of the fixed component.

Alternatively, said at least one magnetic actuator may comprise a plurality of permanent magnets circumferentially spaced about a longitudinal axis of the movable component. Preferably, said plurality of permanent magnets may be arranged so as to emanate a magnetic field in a direction that is generally normal to a surface of the fixed component. Even more preferably, said at least one permanent magnet may be adapted to provide a magnetic field having a magnetic flux density sufficient to actuate any one of said plurality of magnetic sensors. This provides the advantage of a broader coverage, allowing additional rotational movement (intentional or unintentional) of the moveable component, such as a sleeve, without losing the actuator signal.

The apparatus may further comprise a controller adapted to receive and process said discrete signal output so as to determine the position and/or speed of the moveable component relative to the fixed component. Additionally, the apparatus may further comprise at least one temperature sensor and/or at least one pressure sensor, operatively coupled to said controller. Advantageously, the apparatus may further comprise a transmitter adapted to transmit data to a remote location. Preferably, said transmitter may be adapted to transmit data wirelessly. This provides the advantage that the measured signals can be processed to determine not just discrete positions of actuated sensors, but also to use the "history" of the sensor outputs to determine the positions between the discrete sensors. The sensor output may also be used to determine the speed of the moveable component. Being able to determine ambient temperature provides the advantage that output signals can be corrected for temperature changes.

According to a third aspect of the invention there is provided a downhole tool for operation in a well, comprising an apparatus according to the second aspect of the present invention.

BRIEF DESCRIPTION OF THE DRAWINGS

Preferred embodiments of the present invention will now be described, by way of example only and not in any limitative sense, with reference to the accompanying drawings, in which:

FIG. 9 shows (a) the magnetic field distribution of a disc or button shaped permanent magnet placed on a metal plate (not to scale), an example enclosure for the permanent magnet (b) inside view of the enclosure, (c) outside view of the enclosure, (d) top view of assembled enclosure (housing and lid) and (e) bottom view of the assembled enclosure;

FIG. 11 shows an illustration of two different designs of the implementation of the permanent magnets, (a) three magnets spaced apart by 120°, (b) two permanent magnets covering most of the circumference of the sleeve.

DETAILED DESCRIPTION OF THE PREFERRED EMBODIMENT(S)

The exemplary embodiment of this invention will be described in relation to downhole tools and downhole operations. However, it should be appreciated that, in general, the system and method of this invention will work equally well for any other tools or mechanisms where knowing the exact position of moveable components is of any significance.

For purposes of explanation, it should be appreciated that the terms 'determine', 'calculate' and 'compute', and variations thereof, as used herein are used interchangeably and include any type of methodology, process, mathematical operation or technique. The terms 'generating' and 'adapting' are also used interchangeably describing any type of signal processing.

(i) Preferred Embodiment of the Magnetic Sensor Array

In a preferred example, the magnetic sensor array 100 of the present invention may be used in a position indicator apparatus 200 (i.e. including a magnetic actuator) to monitor and/or control the opening and closing of a downhole sliding sleeve allowing, for example, optimization of production flow rate from different zonal isolations.

Figure 1:
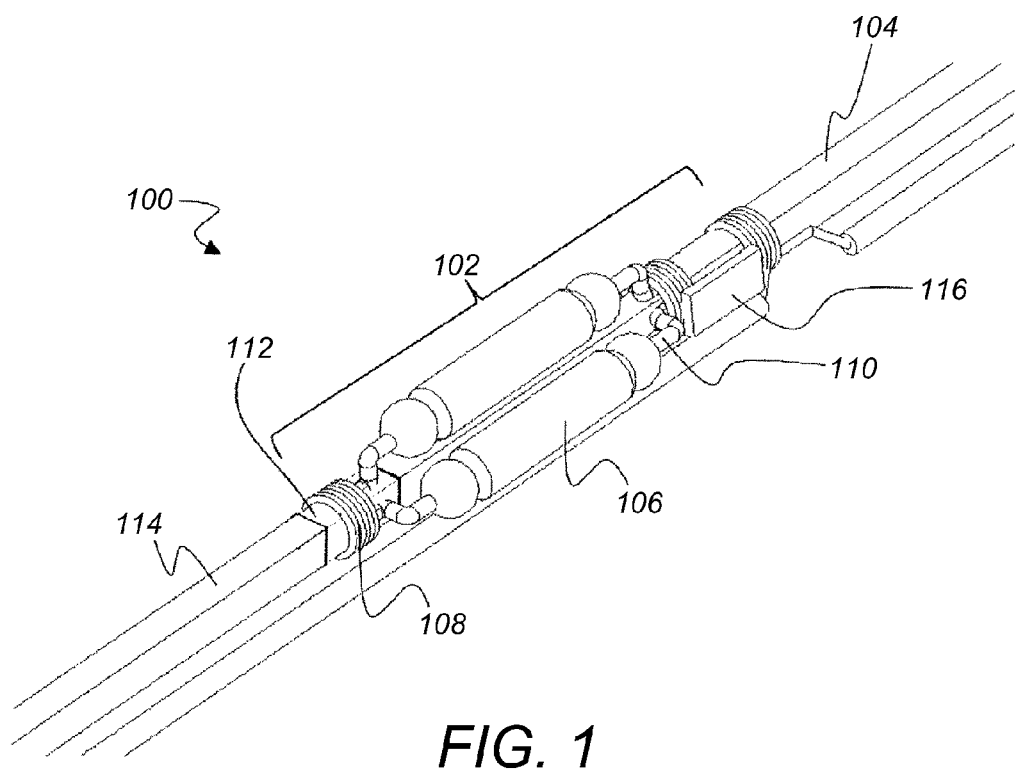
FIG. 1 shows a perspective view of a preferred embodiment of the magnetic sensor array of the present invention without the insulation shrink tube encasement.
Figure 2:
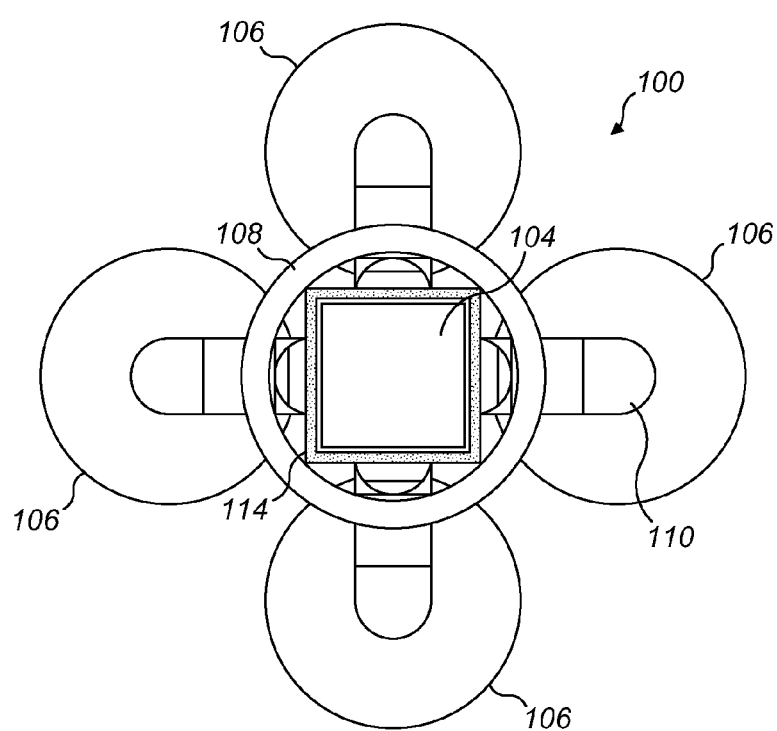
FIG. 2 shows a front view of the magnetic sensor array shown in FIG. 1.

Referring now to FIG. 1 and FIG. 2, a simplified perspective illustration of part of the magnetic sensor array 100 (FIG. 1), as well as, a front view of the magnetic sensor array 100 (FIG. 2) is shown without the insulating encasement. In particular, in the preferred example, the magnetic sensor array 100 comprises four magnetic sensors 102 operably coupled to a copper wire 104. The four magnetic sensors 102 are spaced equidistantly along the longitudinal axis of the copper wire 104. The distance between the magnetic sensors 102 depends on the application and dimensions of, for example, the sliding sleeve it is installed with. However, it is understood by the person skilled in the art that the distance between the magnetic sensors 102 can also be non-equidistant, i.e. the distances may change according to a logarithmic or exponential function, or any other function suitable for a specific application. Each of the magnetic sensors 102 includes four Reed switches 106 that are arranged around the longitudinal axis of the copper wire 104 so that two respective Reed switch 106 are located on opposite sides of the copper wire 104. In the preferred example, the copper wire 104 has a square cross section, so that one Reed switch 106 can be located on one of the four sides of the copper wire 104. This provides improved redundancy and rotational freedom during use.

However, it is understood by the skilled person in the art, that any electrically conductive wire or elongated conductor made from any other electrically conductive material may be used, wherein the wire or elongated conductor can have any suitable cross-section.

Each of the four Reed switches 106 is attached to the contact region 112 of the copper wire 104 utilizing any one or all of (i) a thin conductive wire 108 that is wrapped around the contact legs 110 of the Reed switches 106, (ii) conductive adhesive, and/or (iii) conductive solder. The contact legs 110 on the other side of the Reed switches may be secured to a non-contacting region of the copper wire 104, e.g. an region of the copper wire that is encased with an insulating sleeve 114, utilising the thin conductive wire 108 that is wrapped around the contact legs of the Reed switches 106. In the preferred example, the insulating sleeve 114 is located equidistantly between contact regions 112. The insulating sleeve may be an insulting shrink tube.

The use of conductive adhesive (e.g. adhesive) may removes or at least reduces any aggressive flux from, and minimises any cleaning requirements of the assembly.

The four Reed switches 106 of each magnetic sensor 102 are connected so as to form a parallel circuit. Thus, during use, for example in a position indicator system 200, it will not be possible to differentiate, which one of the Reed switches 106 has been triggered.

A resistor network (not shown) is further coupled to the four magnetic sensors 102. The resistor network includes one or more predetermined resistor(s) 116 coupled to respective magnetic sensor 102, so as to form a network that is adapted to output discrete voltage and/or frequency changes in response to the activation of the respective magnetic sensor 102.

To provide protection to the magnetic sensor array, another insulation shrink tube (not shown) is placed over the magnetic sensors 102 and deployed so as to fully encase the array of magnetic sensors 102.

(ii) Manufacture of Magnetic Sensor Array

Referring now to FIGS. 3-6, a specific example of a manufacturing method of the magnetic sensor array of the present invention is described. It is understood that the material used and dimensions given may vary depending on the required application of the magnetic sensor array 100.

Figure 3:
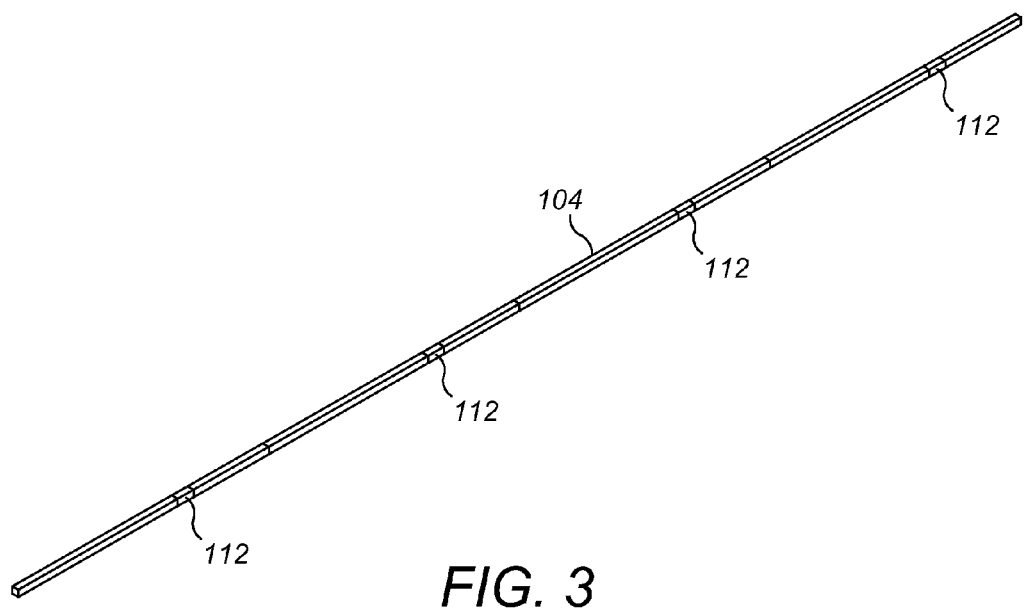
FIG. 3 shows a perspective view of the conductor element (copper wire) during the first step of the manufacture of the magnetic sensor array.
Figure 4:
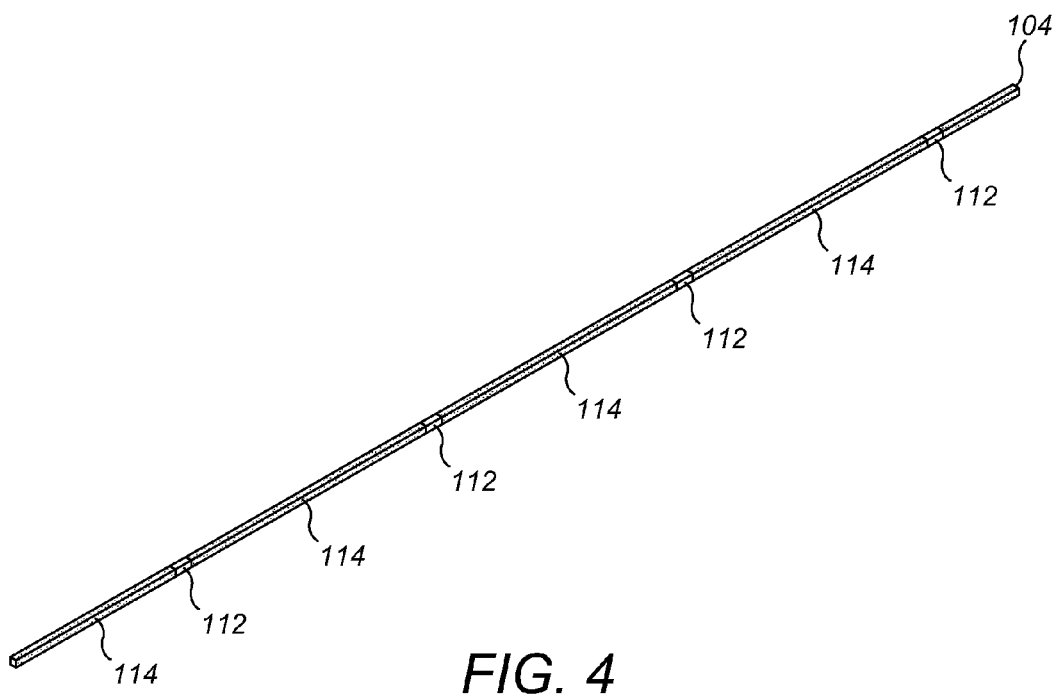
FIG. 4 shows a perspective view of the conductor element (copper wire) and insulation shrink tubes mounted at the intervals between the contact regions during the second step of the manufacture of the magnetic sensor array.

FIG. 3 shows the first step, where a square copper wire or cable 104 is cut to a predetermined length, e.g. 80 cm. About 1 cm of insulation of the cable 104 is removed at four equidistant contact regions 112 using, for example, emery paper grade 400. As shown in FIG. 4, fife sections of shrink tube 114, e.g. 4 cm long, are then located between respective contact regions 112. The shrink tubes 114 are then treated with a heat gun so as to permanently secure the shrink tube sections 114 to the copper wire 104.

Figure 5:
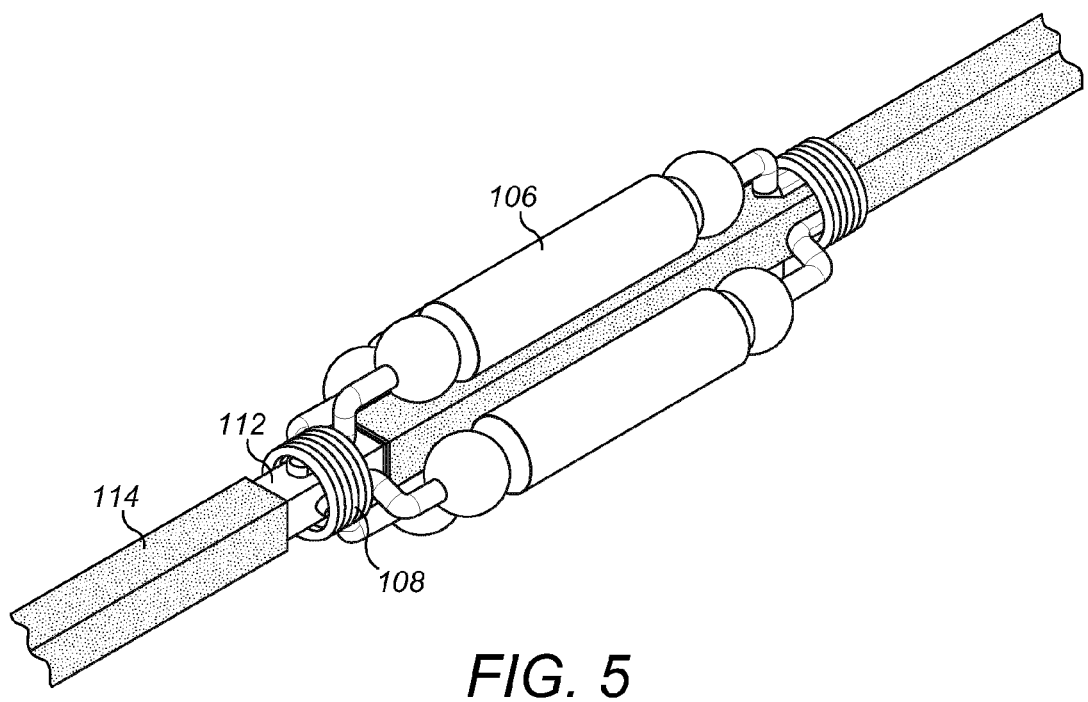
FIG. 5 shows a close-up perspective view of the conductor element and reed switches, wherein the contact legs of the reed switches are secured to respective contact region and insulation tube utilising a metal cable that is wrapped around the contact legs during the third step of the manufacture of the magnetic sensor array.

In the next step, as shown in FIG. 5, four Reed switches 106 (e.g. by Hamlin) are coupled to the contact region 112 of the copper wire 104. A thin wire 108 is wrapped around the four contact legs 110 placed on the contact region 112 to secure the Reed switches 106 in place, i.e. one Reed switch 106 on each side of the square copper wire 104. Conductive adhesive or solder is then applied to operably secure the contact legs 110 to the contact region 112. Examples of the adhesive/solder may be adhesive (e.g H27D by Epotek) or solder (e.g. by Kester).

Figure 6:
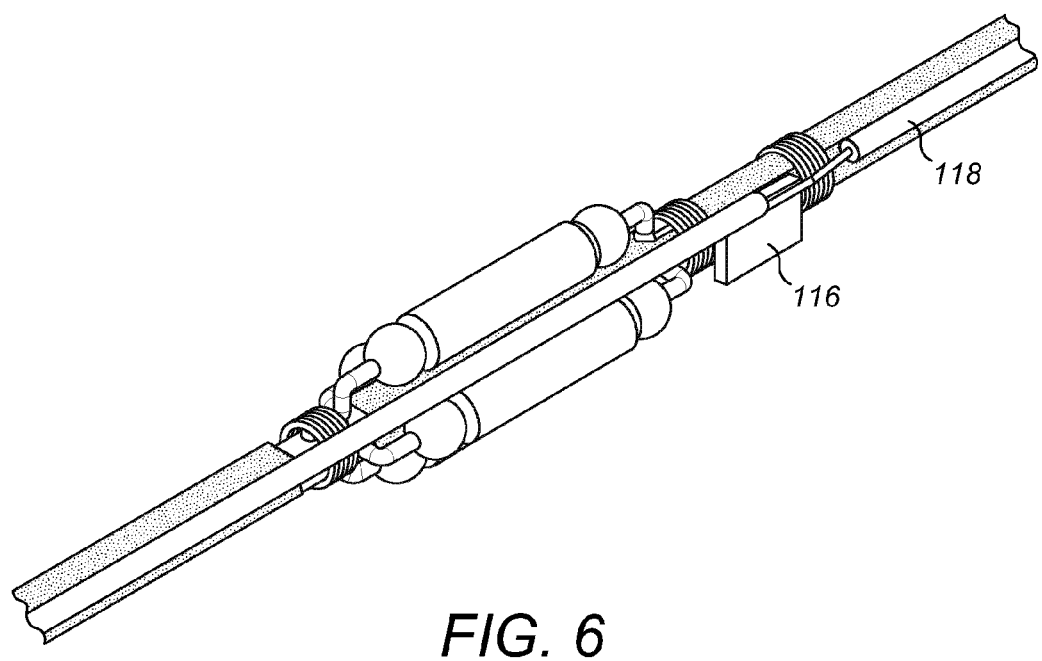
FIG. 6 shows a close-up perspective view of the conductor element and reed switches, as well as, coupled resistor elements during the fourth step of the manufacture of the magnetic sensor array.

In the next step, as shown in FIG. 6, a resistor (e.g. CHR 1206-HT by SRT Resistor Technology) 116 is placed over the shrink tubes 114 and coupled to each of the magnetic sensors 102 (i.e. to one of the contact legs 110 of the Reed switches 106) utilising conductive adhesive or solder. A second copper cable 118 is then placed parallel to the first copper wire 104 and each of the resistors 116 is coupled (e.g. conductive adhesive, solder) to respective contact regions of the second copper cable 118 forming resistor network. In the last step (not shown) a suitable shrink tube is placed over the array of magnetic sensors 102 and deployed using a heat gun, so as to fully encase the four magnetic sensors 102.

Figure 7:
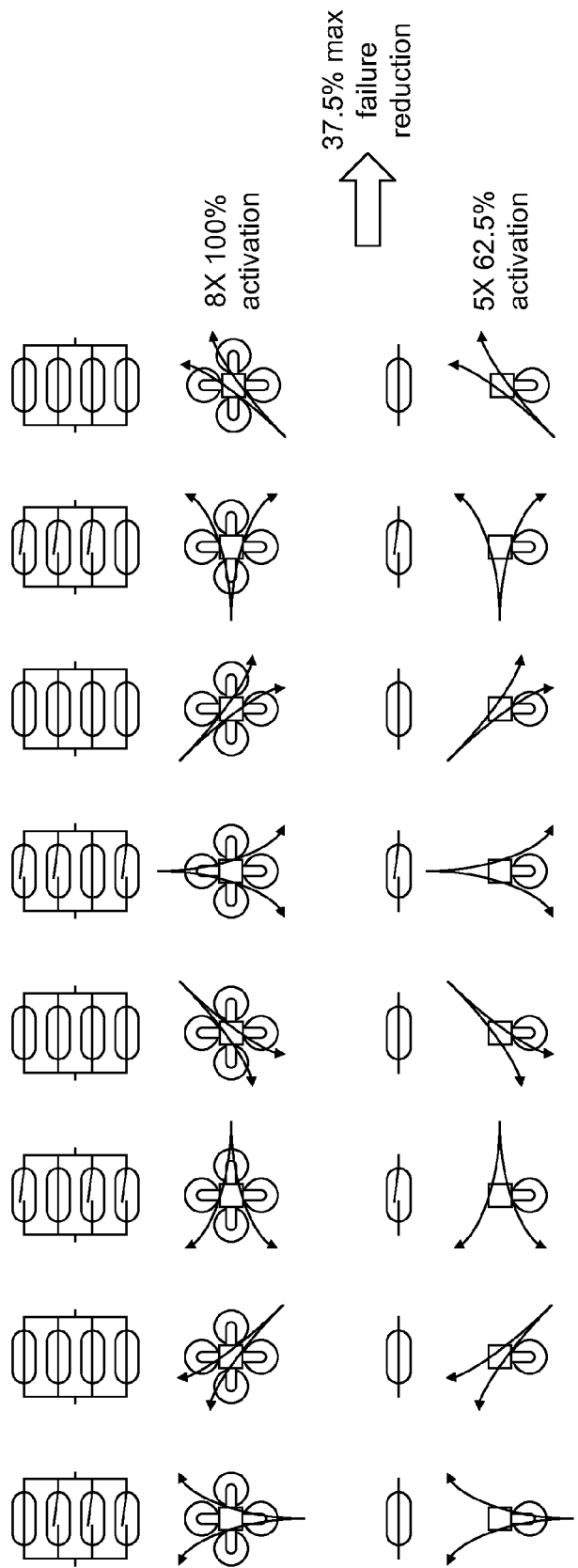
FIG. 7 illustrates the rotational neutrality of a four-sensor design of the magnetic sensor array of the present invention.
Figure 8:
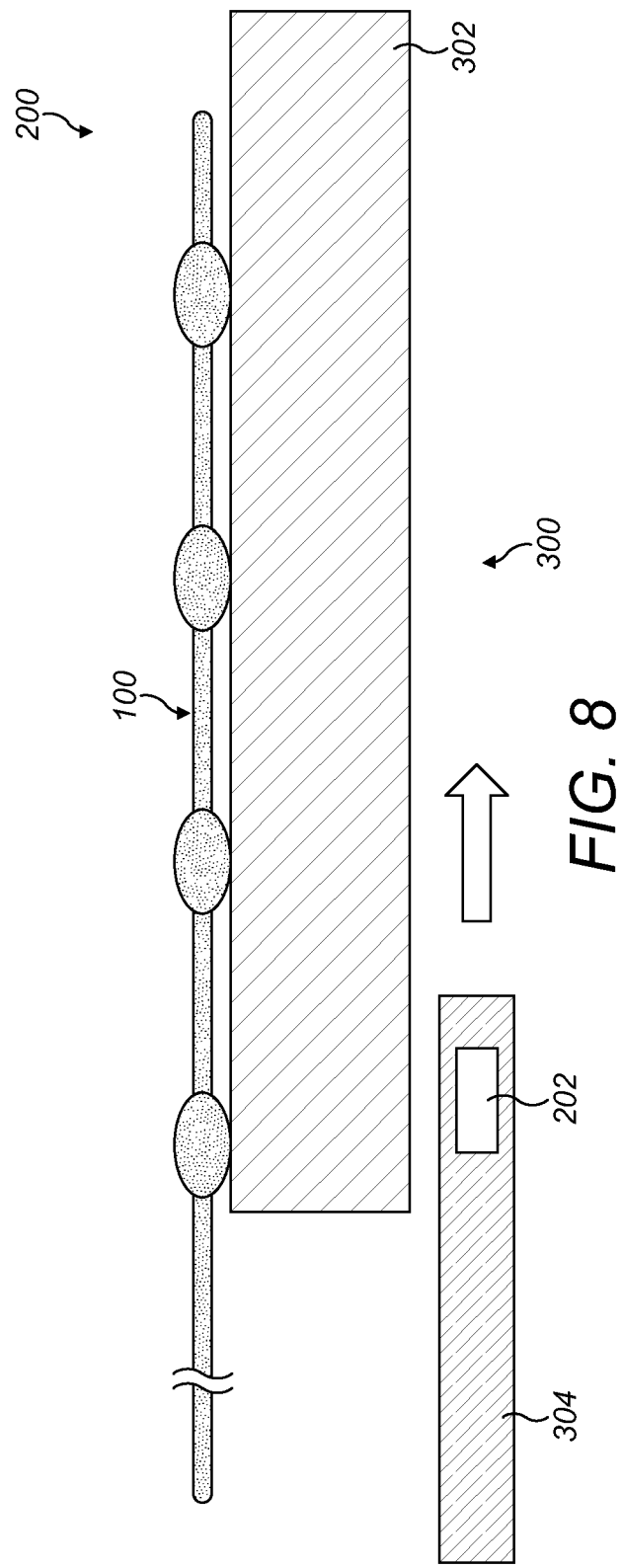
FIG. 8 shows a schematic side view of the magnetic sensor array attached to a fixed component of a tool, and a magnetic actuator embedded within the moveable component of the tool.

FIG. 7 illustrates the rotational neutrality of the four-sensor design of the magnetic sensor array 100 of the present invention. In particular, a constant perpendicular magnetic field is created across the Reed switches 106 providing a constant activation connection regardless of the position. The second row of FIG. 7 illustrates worst case Reed switch activation scenarios assuming activation occurs at 45 deg to 90 deg.

(iii) Position Indicator System

Referring now to FIGS. 8-11, an example of a position indicator system 200 used on a downhole tool 300 is described. The position indicator system 200 comprises the magnetic sensor array 100 and at least one actuator 202 in the form of at least one permanent magnet 202. In this particular example, the magnetic sensor array 100 is positioned on the fixed component 302 of, for example, the downhole tool 300, wherein the actuator 202 is positioned on the moveable component 304, such as a sliding sleeve.

Here, the magnetic sensor array 100 is attached to the downhole tool 300 in such a way that the magnetic sensors 102 are equidistantly spaced along the axial length of a downhole tool 300 in a direction parallel to the movement (see arrow) of the moveable component 304, e.g. sliding sleeve. The permanent magnet 202 is fixed to or embedded in the moving component 304, and therefore move with the inner sleeve 304 relative to the tool housing 302 triggering respective magnetic sensors 102 when passing.

As shown in FIG. 9, it is known that magnetic field distribution and strength of a permanent magnet 202 depend on the magnet's shape and material properties (metal composites). In this particular example, a circular shaped disc magnet (or button magnet) is used. FIG. 9(a) depicts an example of the magnetic field distribution and magnetic flux density of such a permanent magnet, showing effective actuation areas and non-effective actuation areas. FIGS. 9(b)-(e) show examples of the magnet's 202 enclosure, comprising a housing 204 and lid 206, to protect the permanent magnet 202 from the harsh environmental conditions downhole. Preferably, the relative permeability of the enclosure 204, 206 may be similar to air, so as not to affect the magnetic field distribution and strength of the magnet 202.

It is understood by the person skilled in the art that the specific example of an embodiment of the present invention can vary in any one of the exemplified dimensions, numbers and arrangement of magnetic sensors 102 and actuator(s) 202, as well as, the materials used without diverting from the scope of the invention.

Figure 10:
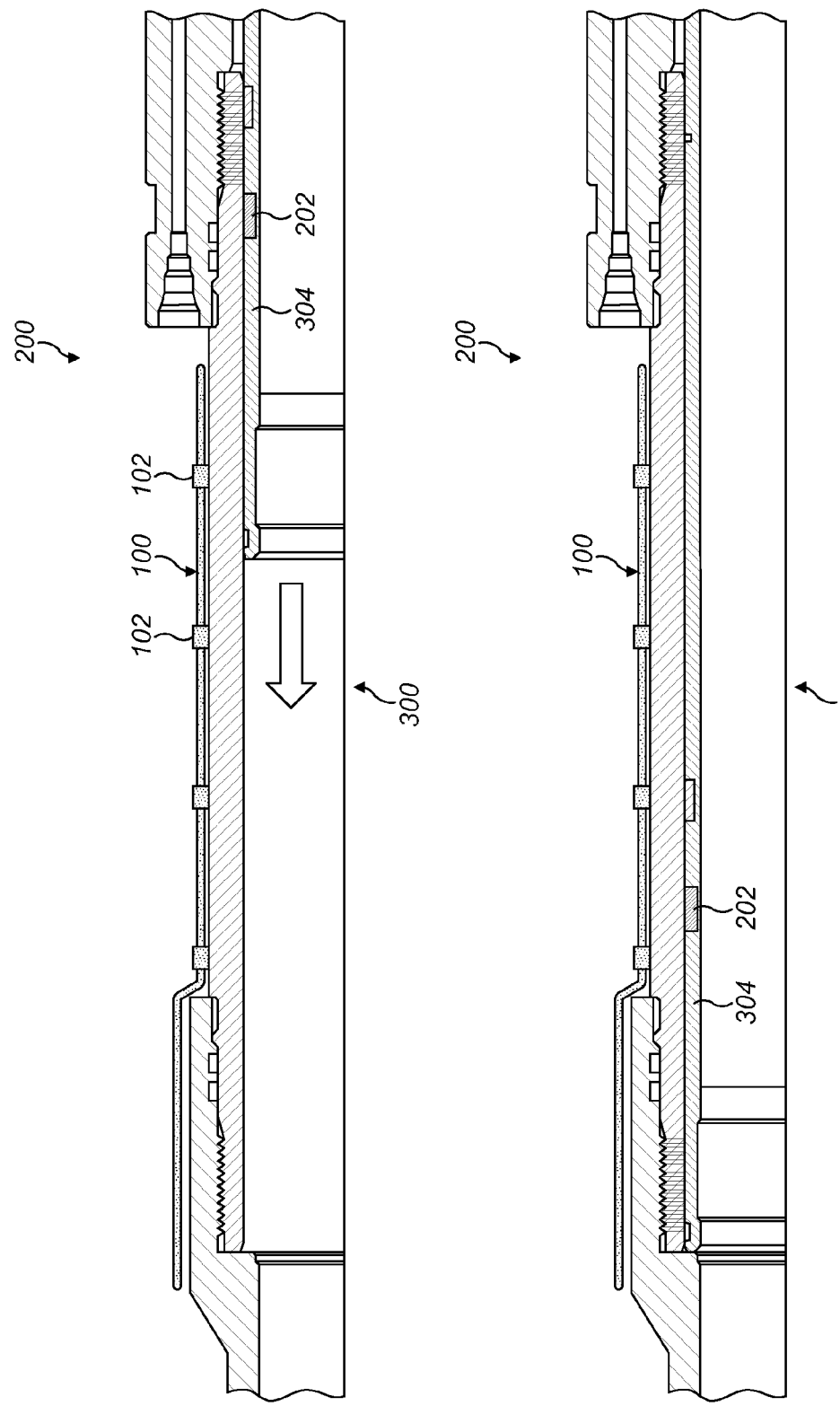
FIG. 10 shows a cross sectional side view of an example of a typical sliding sleeve downhole tool and an installed position indicator system (magnetic sensor array and magnetic actuator)

FIG. 10 illustrates a partial cross-sectioned side view of an example position indicator system 200 installed to of a sliding sleeve downhole tool 300, with the sliding sleeve 304 in (a) a closed position and (b) an open position. During movement of the sliding sleeve 304, the magnet 202 passes and triggers respective magnetic sensors 102 outputting a discrete signal that is indicative of the position of the sliding sleeve 304. In this embodiment, it is not possible to trigger more than one magnetic sensor 102, so that only one signal is provided at a time. Therefore, if the magnetic sensor array includes four magnetic sensors 102, the system is capable to discriminate at least four positions between the open and closed position of the sliding sleeve 304. Additionally, the position indicator system 300 may comprise a controller (not shown) adapted to log position data of the moving sliding sleeve 304 and determine positions between the consecutive magnetic sensors 102 using the logged position history. Thus, the position indicator system 200 can discriminate an additional three positions making it a total of seven positions.

Additional information, such as average speed of the moving inner sleeve 204, may also be determined according to the equation:

$$S = \frac{D}{\Delta T} \quad \quad [\text{Eq. 1}]$$

where, D is the predetermined distance between the Reed-switch sensitivity fringes (e.g. the distance from the centre of one Reed-switch to the adjacent one) and $\Delta T$ is the time it takes from the magnet 202 to move from one actuating position to the next. The time intervals may be determined by an internal clock of a computer processor (e.g. from an Intelligent Downhole Network (IDN) (not shown)).

(iv) Alternative Actuator Embodiment(s)

In the above-described example, a guide slot (not shown) may be used to prevent any rotational movement of the sliding sleeve 304 with respect to the tool housing 302. However, other embodiments of the invention may be used to allow rotational movement of the sliding sleeve 304 with respect to the tool housing 302.

For example, redundancy may be improved by simply adding additional sensor arrays 100 identical to and aligned in parallel to the first sensor array 100, so that corresponding sensors 102 are aligned for all locations (not shown). Reed-switches 106 operate through mechanical movement of two metal strips, which are likely to fail in the harsh environmental conditions found downhole. Thus, providing a plurality of sensors 102 for each position ensures that the risk of losing all sensors for a position is minimised. In addition, adding parallel sensors for each position increases the sensing area and therefore minimising the risk of an actuator 202 failing to actuate a sensor 102.

It is understood by the person skilled in the art, that any suitable arrangement of the sensor arrays 100 may be used to minimise redundancy and maximise the sensor area for each position.

Furthermore, there is a possibility of magnets 202 to align with other downhole objects, such as, for example, communication lines, hydraulic control lines etc. Therefore, alternative actuator designs utilizing permanent magnets are provided to minimise the risk of misalignment between the actuator 202 and sensors 102 during assembly and/or use.

The embodiments described so far, provide an actuator utilizing only one magnet 202. However, it is understood by the person skilled in the art, that any number of magnets that are arranged around the circumference of the sliding sleeve 304 may be used.

FIG. 11(*a*) shows a cross section of a sliding sleeve 304 having three permanent magnets 202 embedded within the sliding sleeve wall arranged at 120° intervals. FIG. 11(*b*) shows a cross section of a sliding sleeve 304 having two permanent magnets 202 embedded within the sliding sleeve wall and covering most of the sliding sleeve's 304 outer circumference. Compared to the more robust design shown in FIG. 11(*b*), the design shown in FIG. 11(*a*) requires a search of the magnet locations. However, the design shown in FIG. 11(*a*) provides a more robust mechanical structure.

It will be appreciated by persons skilled in the art that the above embodiments have been described by way of example only and not in any limitative sense, and that various alterations and modifications are possible without departing from the scope of the invention as defined by the appended claims.

The invention claimed is:

1. A magnetic sensor array for a well apparatus for determining the position of at least one movable component with respect to a fixed component of a downhole tool, comprising:
    a first conductor member having a plurality of contact regions spaced apart at first intervals of at least a first length along a longitudinal axis of said first conductor member;
    a second conductor member;
    a plurality of magnetic sensors, each one comprises a plurality of magnetic sensor elements arranged circumferentially spaced about said longitudinal axis which are operably coupled between one of said plurality of contact regions of the first conductor member and the second conductor member and actuatable by a magnetic field from a magnetic actuator;
    characterized in that:
    the magnetic sensor array further comprises a plurality of first insulation members adapted to sealingly encase each one of said plurality of first intervals of said first conductor member, and
    wherein said plurality of magnetic sensor elements of each one of said plurality of magnetic sensors are circumferentially spaced about said longitudinal axis equidistantly and form a parallel circuit with said first conductor member and wherein each one of said plurality of magnetic sensors comprises two magnetic sensor elements arranged diametrically opposite each other, or four magnetic sensor elements arranged diametrically opposite each other.

2. The magnetic sensor array according to claim 1, wherein said plurality of magnetic sensors are actuatable mutually exclusive of each other.

3. The magnetic sensor array according to claim 1, wherein said plurality of magnetic sensors are connected to a plurality of predetermined resistors, so as to form a resistor network adapted to provide a plurality of discrete signal outputs for each one of said plurality of magnetic sensors.

4. The magnetic sensor array according to claim 3, wherein said discrete signal output is any one of a discrete voltage or discrete frequency.

5. The magnetic sensor array according to claim 1, wherein said first intervals between said plurality of magnetic sensors are equidistant.

6. The magnetic sensor array according to claim 1, wherein said plurality of magnetic sensor elements is a plurality of Reed switches.

7. The magnetic sensor array according to claim 1, further comprising a second insulation member adapted to sealingly encase said magnetic sensor array.

8. An apparatus for determining the position of at least one movable component with respect to a fixed component of a downhole tool, comprising: a magnetic sensor array, comprising:
    a first conductor member having a plurality of contact regions spaced apart at first intervals of at least a first length along a longitudinal axis of said first conductor member;
    a second conductor member;
    a plurality of magnetic sensors, each one comprises a plurality of magnetic sensor elements arranged circumferentially spaced about said longitudinal axis which are operably coupled between one of said plurality of contact regions of the first conductor member and the second conductor member and actuatable by a magnetic field from a magnetic actuator; and
    a plurality of first insulation members adapted to sealingly encase each one of said plurality of first intervals of said first conductor member,
    wherein said plurality of magnetic sensor elements of each one of said plurality of magnetic sensors are circumferentially spaced about said longitudinal axis equidistantly and form a parallel circuit with said first conductor member and wherein each one of said plurality of magnetic sensors comprises two magnetic sensor elements arranged diametrically opposite each other, or four magnetic sensor elements arranged diametrically opposite each other;
    and wherein the magnetic sensor array is coupleable to the fixed component such that a longitudinal axis of said magnetic sensor array is aligned in the direction of movement of the movable component; and at least one magnetic actuator, coupleable to the movable component;

wherein said at least a one magnetic actuator is adapted to actuate any one of a plurality of magnetic sensors of said magnetic sensor array, so as to effect a discrete signal output for each one of a predetermined number of positions of said moveable component relative to said fixed component.

9. The apparatus according to claim 8, wherein said magnetic sensor array comprises two or more equivalent parallel rows of said plurality of magnetic sensors, arranged such that positions of corresponding said magnetic sensors are aligned with respect to each other in the direction of movement of the moveable component.

10. The apparatus according to claim 9, wherein said sensor array comprises two or more equivalent parallel rows of said plurality of magnetic sensors, arranged such that positions of corresponding said magnetic sensors are offset with respect to each other in the direction of movement of the moveable component.

11. The apparatus according to claim 8, wherein said at least one magnetic actuator comprises at least one permanent magnet arranged so as to emanate a magnetic field in a direction that is generally normal to a surface of the fixed component.

12. The apparatus according to claim 11, wherein said at least one permanent magnet is adapted to provide a magnetic field having a magnetic flux density sufficient to actuate any one of said plurality of magnetic sensors.

13. The apparatus according to claim 8, wherein said at least one magnetic actuator comprises a plurality of permanent magnets circumferentially spaced about a longitudinal axis of the movable component.

14. The apparatus according to claim 13, wherein said plurality of permanent magnets is arranged so as to emanate a magnetic field in a direction that is generally normal to a surface of the fixed component.

15. The apparatus according to claim 8, further comprising a controller adapted to receive and process said discrete signal output so as to determine the position and/or speed of the moveable component relative to the fixed component.

16. The apparatus according to claim 15, further comprising at least one temperature sensor and/or at least one pressure sensor, operatively coupled to said controller.

17. The apparatus according to claim 8, further comprising a transmitter adapted to transmit data to a remote location.

18. The downhole tool for operation in a well, comprising an apparatus according to claim 8.

* * * * *

UNITED STATES PATENT AND TRADEMARK OFFICE
CERTIFICATE OF CORRECTION

PATENT NO. : 9,976,411 B2
APPLICATION NO. : 15/518144
DATED : May 22, 2018
INVENTOR(S) : Michael Scott Page 1 of 1

It is certified that error appears in the above-identified patent and that said Letters Patent is hereby corrected as shown below:

In the Claims

Column 9
Line 63, change "each one comprises" to --each one of which comprises--
Lines 65-66, change "longitudinal axis are operably coupled" to --longitudinal axis and wherein the plurality of magnetic sensor elements are operably coupled--

Column 10
Line 1, change "and actuatable" to --and are actuatable--
Line 47, change "each one comprises" to --each one of which comprises--
Lines 49-50, change "longitudinal axis which are operably coupled" to --longitudinal axis and wherein the plurality of magnetic sensor elements are operably coupled--
Line 52, change "and actuatable" to --and are actuatable--

Signed and Sealed this
Twentieth Day of November, 2018

Andrei Iancu
*Director of the United States Patent and Trademark Office*